(12) United States Patent
Hughlett et al.

(10) Patent No.: US 11,651,942 B2
(45) Date of Patent: May 16, 2023

(54) SYSTEM AND METHOD FOR PLASMA HEAD HELIUM MEASUREMENT

(71) Applicant: Ontos Equipment Systems, Inc., Chester, NH (US)

(72) Inventors: Robert Emmett Hughlett, Waterbury, VT (US); Daniel Pascual, Wolcott, VT (US); David Meyer, Jeffersonville, VT (US); Michael Dow Stead, Jeffersonville, VT (US)

(73) Assignee: Ontos Equipment Systems, Inc., Chester, NH (US)

( * ) Notice: Subject to any disclaimer, the term of this patent is extended or adjusted under 35 U.S.C. 154(b) by 252 days.

(21) Appl. No.: 17/118,802

(22) Filed: Dec. 11, 2020

(65) Prior Publication Data
US 2021/0193442 A1    Jun. 24, 2021

Related U.S. Application Data

(60) Provisional application No. 62/949,617, filed on Dec. 18, 2019.

(51) Int. Cl.
*H01J 37/32* (2006.01)

(52) U.S. Cl.
CPC .. *H01J 37/32825* (2013.01); *H01J 37/32018* (2013.01); *H01J 37/32449* (2013.01); *H01J 2237/24564* (2013.01)

(58) Field of Classification Search
CPC ........... H01J 37/32825; H01J 37/32018; H01J 37/32449; H01J 2237/24564
See application file for complete search history.

(56) References Cited

U.S. PATENT DOCUMENTS

| 5,968,377 | A | 10/1999 | Yuasa et al. |
| 6,009,742 | A | 1/2000 | Balko |
| 6,429,400 | B1 | 8/2002 | Sawada et al. |
| 7,764,186 | B2 * | 7/2010 | Krcma ................ G01N 27/14 |
| | | | 73/31.06 |
| 2003/0116281 | A1 | 6/2003 | Herbert et al. |
| 2006/0211253 | A1 | 9/2006 | Chen et al. |
| 2007/0274868 | A1 | 11/2007 | Brown |
| 2018/0122624 | A1 * | 5/2018 | Hughlett .......... H01J 37/32825 |
| 2020/0088669 | A1 | 3/2020 | König |

OTHER PUBLICATIONS

ISR for PCT/US2020/064779; PCT Filing Date Dec. 14, 2020.

* cited by examiner

*Primary Examiner* — Henry Luong
(74) *Attorney, Agent, or Firm* — AKC Patents, LLC; Aliki K. Collins

(57) ABSTRACT

An atmospheric pressure plasma system includes an atmospheric pressure plasma source that generates a glow discharge-type plasma. The atmospheric pressure plasma source comprises a plasma head and a gas sensor system. The plasma head includes a gas inlet, a gas passage surrounded by a dielectric liner, a radio frequency (RF) electrode and a ground electrode. The RF electrode and the ground electrode are arranged at opposite sides of an outer surface of a segment of the gas passage. The gas sensor system comprises a first pellistor that is exposed to a process gas entering the gas inlet and provides real-time monitoring of the presence and concentration of helium in the process gas entering the gas inlet during plasma operation.

18 Claims, 10 Drawing Sheets

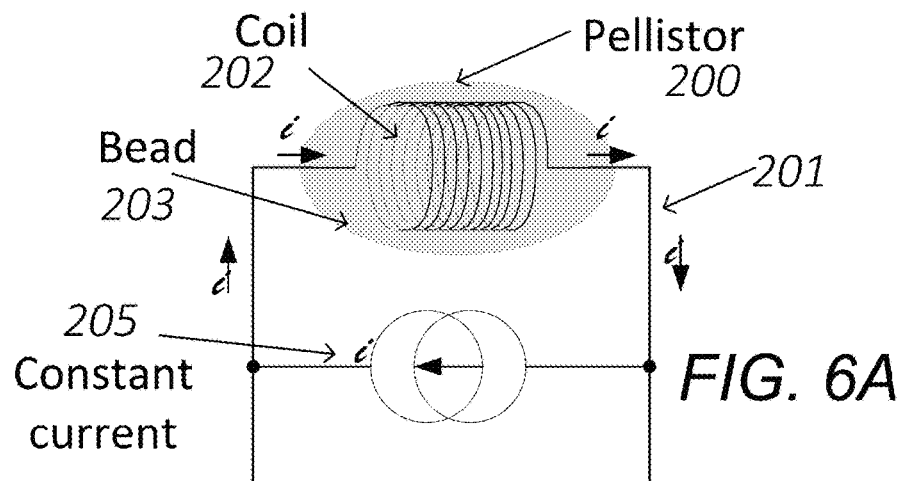
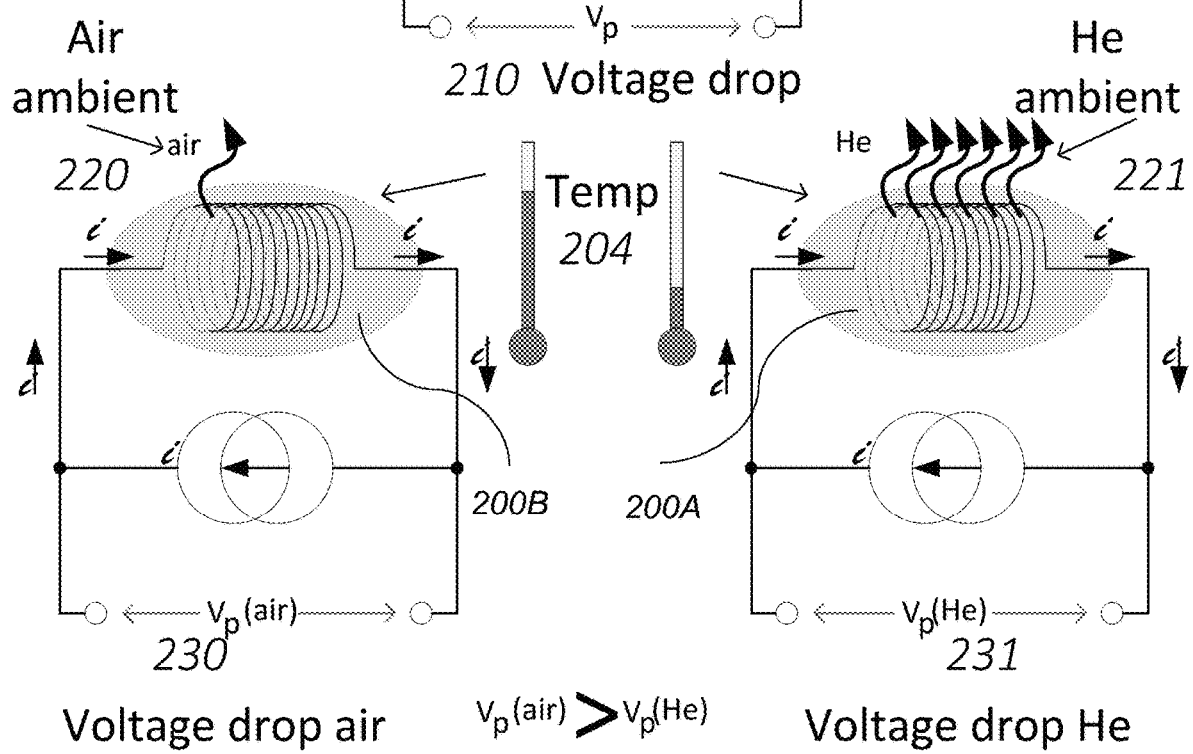
FIG. 6A
FIG. 6B  FIG. 6C

SYSTEM AND METHOD FOR PLASMA HEAD HELIUM MEASUREMENT

CROSS REFERENCE TO RELATED CO-PENDING APPLICATIONS

This application claims the benefit of U.S. provisional application Ser. No. 62/949,617 filed on Dec. 18, 2019 and entitled "SYSTEM AND METHOD FOR PLASMA HEAD HELIUM MEASUREMENT", which is commonly assigned and the contents of which are expressly incorporated herein by reference.

This application is also a continuation-in-part of U.S. application Ser. No. 15/797,017 filed Oct. 30, 2017, now U.S. Pat. No. 10,672,594 B2 issued Jun. 2, 2020 and entitled "SYSTEM AND METHOD FOR PLASMA HEAD THERMAL CONTROL", which is commonly assigned and the contents of which are expressly incorporated herein by reference.

FIELD OF THE INVENTION

The present invention relates to a system and a method for measuring the presence and concentration of helium in the process gas within an atmospheric plasma system.

BACKGROUND OF THE INVENTION

Wafer-to-wafer bonding at temperatures lower than 100° C. usually involves activation of the wafer surfaces via a plasma. Wafer surface activation via a plasma reduces the processing temperature and increases the wafer bonding strength. The wafer bonding strength is increased due to the increased amount of Si—OH groups, removal of wafer surface-contaminants, enhancement of viscous flow of the surface layer and enhancement of the diffusivity of water and gas trapped at the interface. In particular, atmospheric pressure plasma activated bonding involves igniting a plasma without using a low pressure environment. Examples of atmospheric pressure plasma systems for surface preparation are the Ontos 7 and OntosTT, manufactured by Setna Corporation LLC, Chester, N.H. 03036. USA, incorporated herein by reference.

The concentration of helium e process gas of the atmospheric pressure plasma system is critical for the smooth operation of the plasma head, for providing optimal plasma ignition timing and for ensuring that the system can be shut down when the concentration of helium in the process gas drops below a threshold value. Accordingly, there is a need for systems and methods that provide real-time monitoring of the concentration of helium in the process gas during plasma operation.

SUMMARY OF THE INVENTION

The present invention relates to a system and a method for measuring the presence and concentration of helium in the process gas within an atmospheric plasma system. The measurement provides optimal timing for plasma ignition within the plasma head by enabling a controlled delay of the plasma ignition in order to ensure that the concentration of helium in the process gas is high enough for safe ignition and early enough so that a minimum of time and process gas flow is expended before plasma processing begins. Real-time monitoring of the concentration of helium in the process gas during plasma operation also ensures that the system can be shut down when the concentration of helium in the process gas drops below a threshold value.

In general, in one aspect, the invention features an atmospheric pressure plasma system including an atmospheric pressure plasma source that generates a glow discharge-type plasma. The atmospheric pressure plasma source comprises a plasma head and a gas sensor system. The plasma head includes a gas inlet, a gas passage surrounded by a dielectric liner, a radio frequency (RF) electrode and a ground electrode. The RF electrode and the ground electrode are arranged at opposite sides of an outer surface of a segment of the gas passage. The gas sensor system comprises a first pellistor that is exposed to a process gas entering the gas inlet and provides real-time monitoring of the presence and concentration of helium in the process gas entering the gas inlet during plasma operation.

Implementations of this aspect of the invention may include one or more of the following features. The first pellistor comprises a thermo-resistive pellistor and the thermo-resistive pellistor comprises an electrical resistance that decreases monotonically as the first pellistor is cooled by the increasing concentration of helium in the process gas. The first pellistor comprises a coil supported in a refractory bead and the refractory bead of the first pellistor is supported in an open housing and is exposed to the process gas. The gas sensor system further comprises a second pellistor and the refractory bead of the second pellistor is supported in a closed housing that contains air. The system further includes a bridge circuit, and the bridge circuit comprises the first and second pellistors. A voltage drop across the coil of the first pellistor is measured and compared to a voltage drop across the coil of the second pellistor with the bridge circuit to provide a bridge circuit output. The bridge circuit output increases monotonically with the increasing helium concentration in the process gas and is used to measure the helium concentration in the process gas. The system further includes a comparator and a plasma-off safety circuit. The comparator compares the measured helium concentration in the process gas to a threshold value and activates the plasma-off safety circuit if the measured helium concentration in the process gas is below the threshold value. The comparator compares the measured helium concentration in the process gas to a threshold value and activates the plasma-off safety circuit if the measured helium concentration in the process gas transitions from a value above the threshold value to a value below the threshold value. The system further includes an analog to digital conversion (ADC) circuit and the ADC circuit converts the measured helium concentration in the process gas to a digital signal that is used to trigger plasma ignition. The process gas comprises a thermal conductivity that is less than the thermal conductivity of air. The process gas comprises one of helium, hydrogen, nitrogen, oxygen, or mixtures thereof.

In general, in another aspect, the invention features a method for measuring the presence and concentration of helium in a process gas in an atmospheric pressure plasma source including the following. First, providing an atmospheric pressure plasma source that generates a glow discharge-type plasma. The atmospheric pressure plasma source comprises a plasma head and a gas sensor system. The plasma head comprises a gas inlet, a gas passage surrounded by a dielectric liner, a radio frequency (RF) electrode and a ground electrode and the RF electrode and the ground electrode are arranged at opposite sides of an outer surface of a segment of the gas passage. The gas sensor system comprises a first pellistor. Next, exposing the first pellistor to a process gas entering the gas inlet and measuring the first pellistor's electrical resistance. The first pellistor comprises a thermo-resistive pellistor and the thermo-resistive pellistor comprises an electrical resistance that decreases monotonically with increasing concentration of helium in the process gas. The first pellistor comprises a coil supported in a refractory bead and the refractory bead of the first pellistor is supported in an open housing and is exposed to the process gas. The gas sensor system further comprises a second pellistor and the refractory bead of the second pellistor is supported in a closed housing that contains air. The method further includes providing a bridge circuit, that includes said first and second pellistors, and measuring a voltage drop across the coil of the first pellistor and comparing it to a voltage drop across the coil of the second pellistor with the bridge circuit. The bridge circuit provides an output that increases monotonically with the increasing helium concentration in the process gas and is used to measure the helium concentration in the process gas. The method further includes providing a comparator and a plasma-off safety circuit, and then comparing the measured helium concentration in the process gas to a threshold value with the comparator, and then activating the plasma-off safety circuit if the measured helium concentration in the process gas is below the threshold value. The method further includes activating the plasma-off safety circuit if the measured helium concentration in the process gas transitions from a value above the threshold value to a value below the threshold value. The method further includes providing an analog to digital conversion (ADC) circuit, and then converting the measured helium concentration in the process gas to a digital signal with the ADC circuit, and then using the digital signal to trigger plasma ignition.

Among the advantages of this invention may be one or more of the following. A required minimum density of helium in the process gas is maintained as the dominant gas species in the process gas mix. The plasma head is protected from destructive RF-energy point-arcing due to insufficient helium concentration in the process gas. Insufficient helium concentration is detected at plasma ignition (start-up) and during plasma generation due to a surprise decrease in helium gas supply. Additionally, by monitoring the helium concentration during the pre-ignition ramp-up process, the ignition start-up time is minimized. Minimized ignition time reduces process cycle time, enabling high frequency cycling of plasma ignition. High frequency ignition enables higher throughput (units per hour). Minimized start-up time reduces unnecessary and wasteful consumption of helium dominant process gas.

BRIEF DESCRIPTION OF THE DRAWINGS

Referring to the figures, wherein like numerals represent like parts throughout the several views:

FIG. 6A depicts the construction of a pellistor 200;

FIG. 6B depicts the construction and thermo-resistive properties of a pellistor 200 in ambient air 220;

FIG. 6C depicts the construction and thermo-resistive properties of a pellistor 200 in ambient helium 221;

DETAILED DESCRIPTION OF THE INVENTION

The present invention relates to a system and a method for measuring the presence and concentration of helium in the process gas within an atmospheric plasma system.

Figure 1:
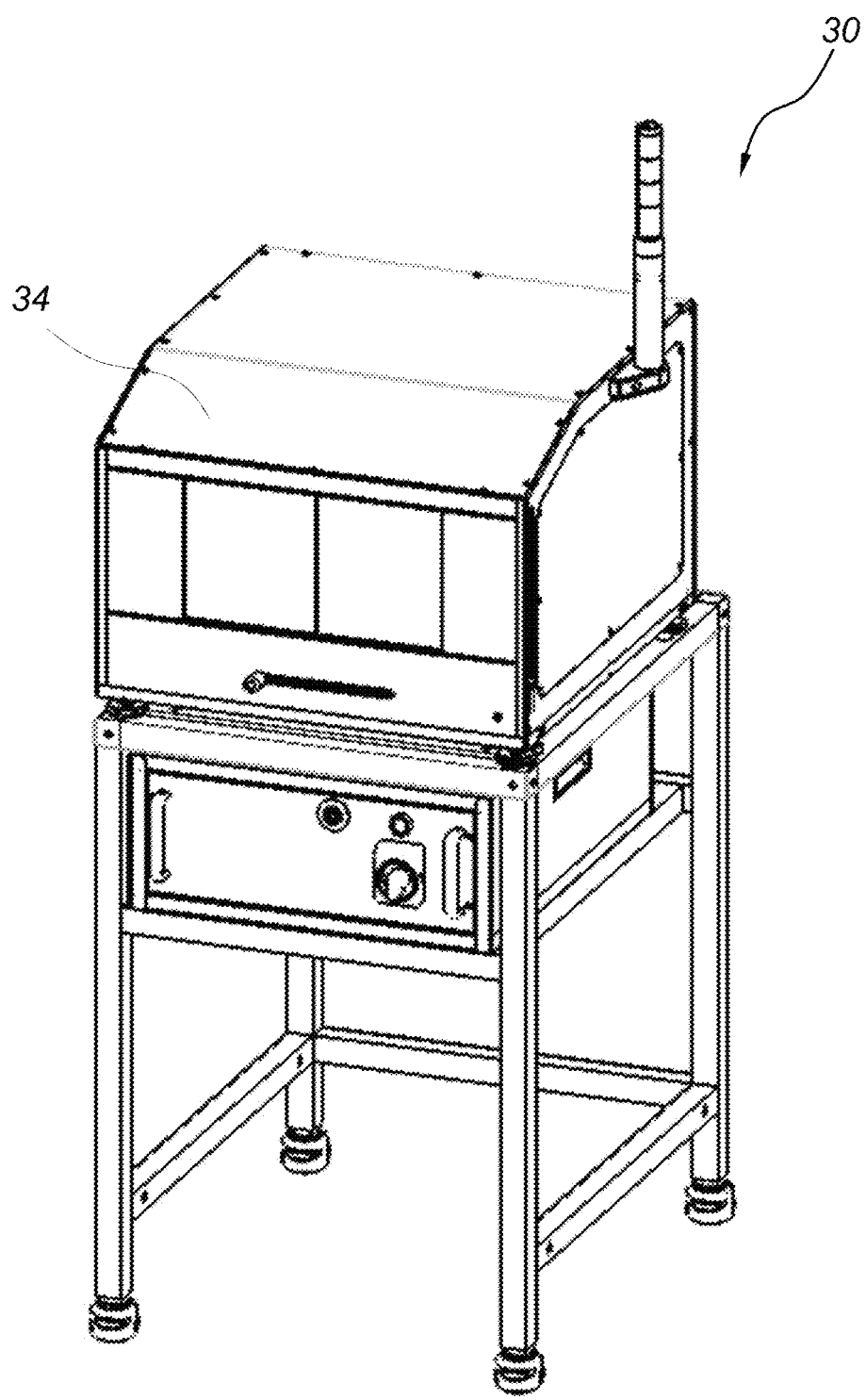
FIG. 1 depicts an example of an atmospheric pressure plasma system 30.
Figure 2:
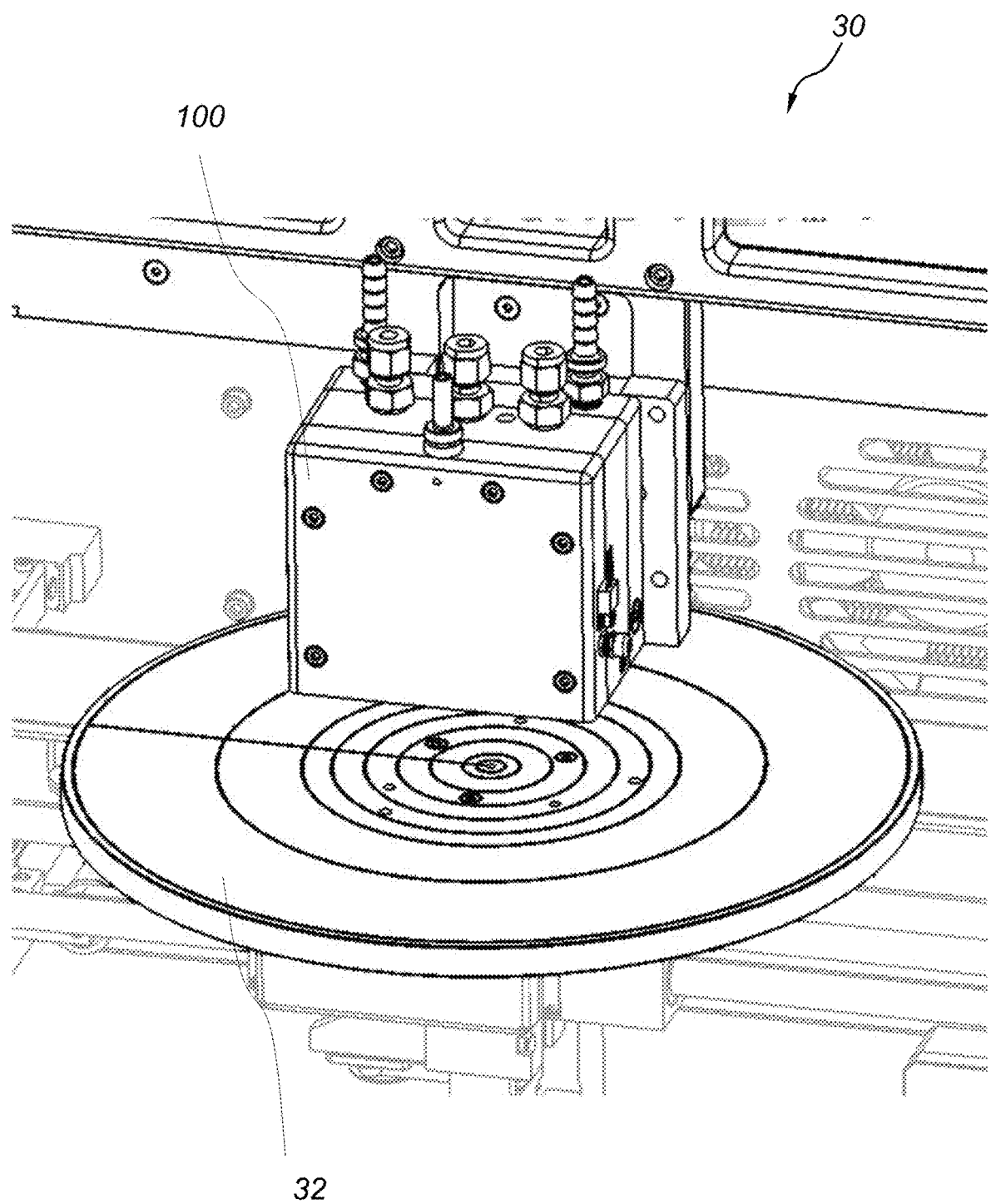
FIG. 2 depicts the plasma head 100 and the substrate holder 32 in the atmospheric pressure plasma system of FIG. 1.
Figure 4:
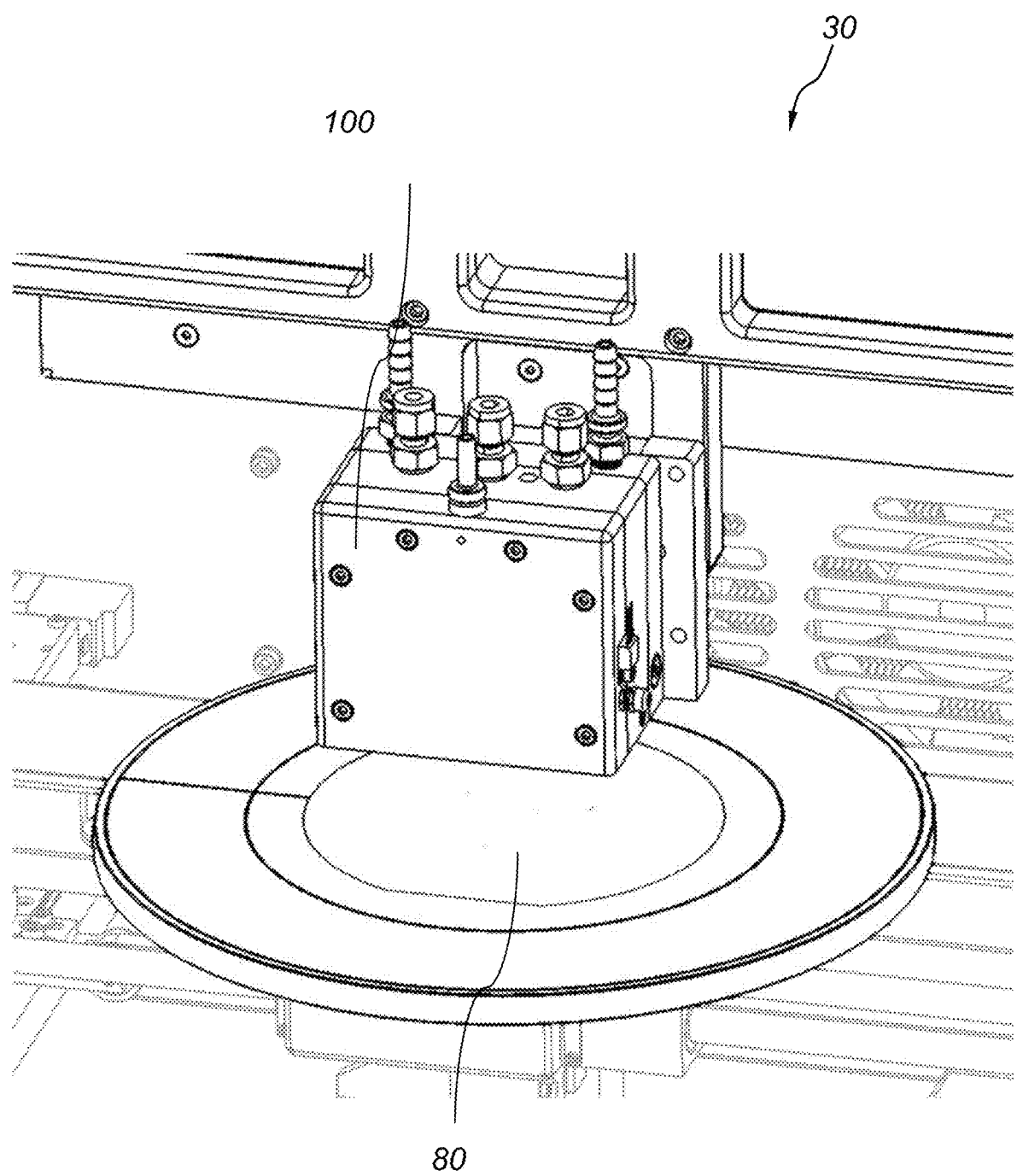
FIG. 4 depicts the plasma head 100 of the atmospheric pressure plasma system of FIG. 1 activating the surface of a wafer 80.

Examples of atmospheric pressure plasma systems for surface preparation include the Ontos 7 and OntosTT, manufactured by Setna Corporation LLC, Chester, N.H. 03036, USA. OntosTT is shown in FIG. 1. Ontos 7 is described in U.S. patent application Ser. No. 15/797,017 filed on Oct. 30, 2017, now U.S. Pat. No. 10,672,594 B2 issued Jun. 2, 2020, and entitled SYSTEM AND METHOD FOR PLASMA HEAD THERMAL CONTROL, which is commonly assigned and the contents of which are expressly incorporated herein by reference. Both Ontos 7 and OntosTT include a uniquely-designed atmospheric plasma source 100 with a 10 mm to 50 mm-wide process zone 32, shown in FIG. 2. Substrates 80 with diameters frons 2 mm up to 300 mm are supported on a computer controlled X-Y-Z stage, as shown in FIG. 4. OntosTT plasma source ignites a plasma at specific local areas or the surface of the substrate 80.

Figure 3:
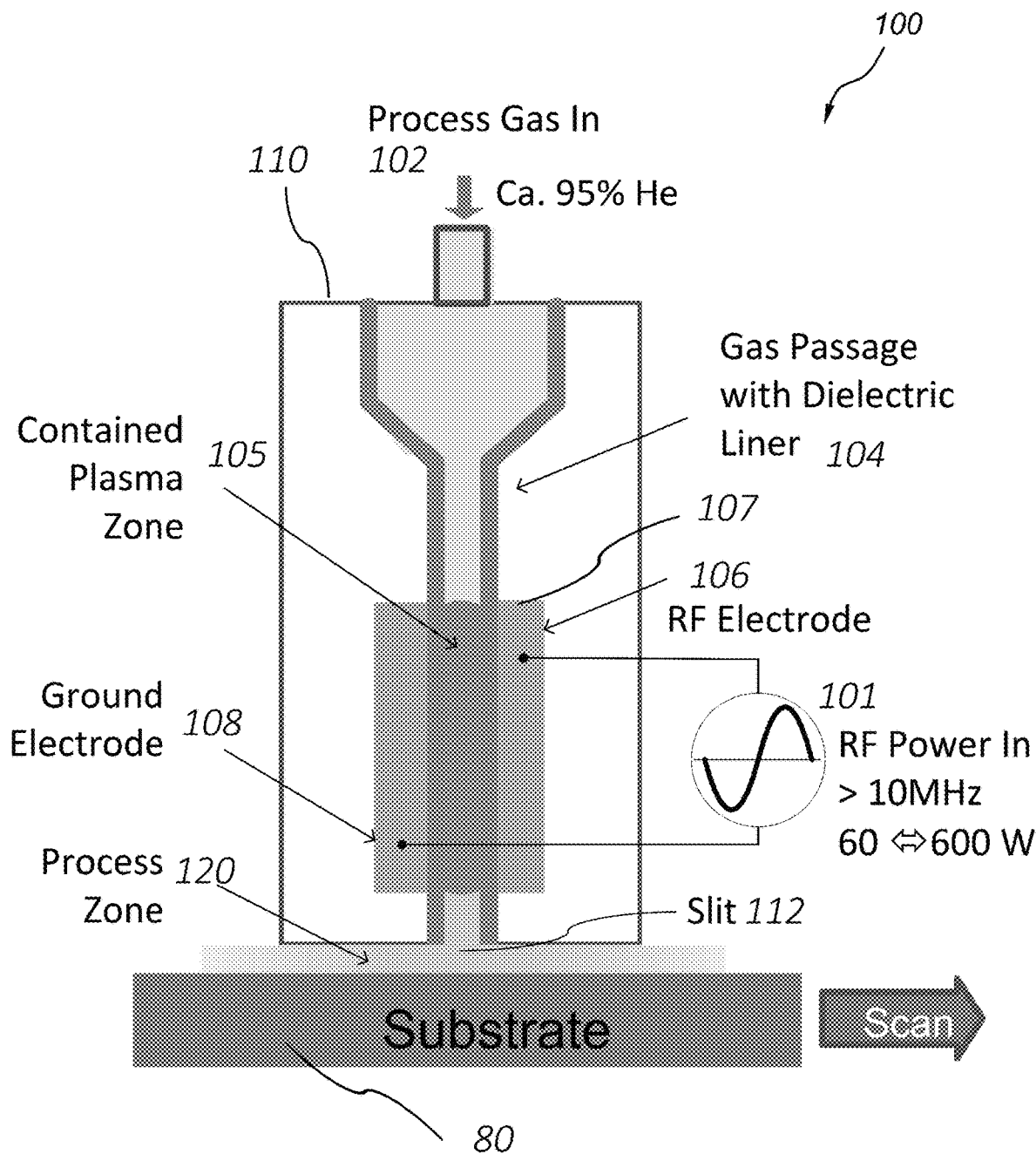
FIG. 3 is a cross-section schematic diagram of the plasma head 100 of the atmospheric pressure plasma system of FIG. 1.

Referring to FIG. 3, the atmospheric plasma head 100 of plasma system 30 includes a process gas inlet 102, a gas passage with a dielectric liner 104, an RE electrode 106 and a ground electrode 108. RF electrode 106 and ground electrode 108 are arranged at opposite sides of a segment 107 of the gas passage 104. Gas enters the passage with the dielectric liner 104 through inlet 102 and passes through segment 107. Between the two electrodes 106, 108 in segment 107, a glow discharge-type plasma is generated via an RF power source 101. The plasma is completely contained within the plasma head 100. The plasma exits the gas passage via a slit 112 and enters a process zone area 120 immediately above the substrate 80. Laminar flow of the plasma gas in the process zone area 120 excludes the atmosphere from the process zone area 120 and thus vacuum is not needed. The activated plasma gas in the process zone area 120 is a cool gas with a temperature lower than 100° C. and does not include ions or hot electrons. The electrodes are driven via RF power of 30 W to 600 W at 13.56 MHz. A safe interlocked enclosure 34 with safety interrupts surrounds the plasma head, shown in FIG. 1. In one example, the plasma output slit 112 has a length in the range of 10 mm to 50 mm.

Figure 5:
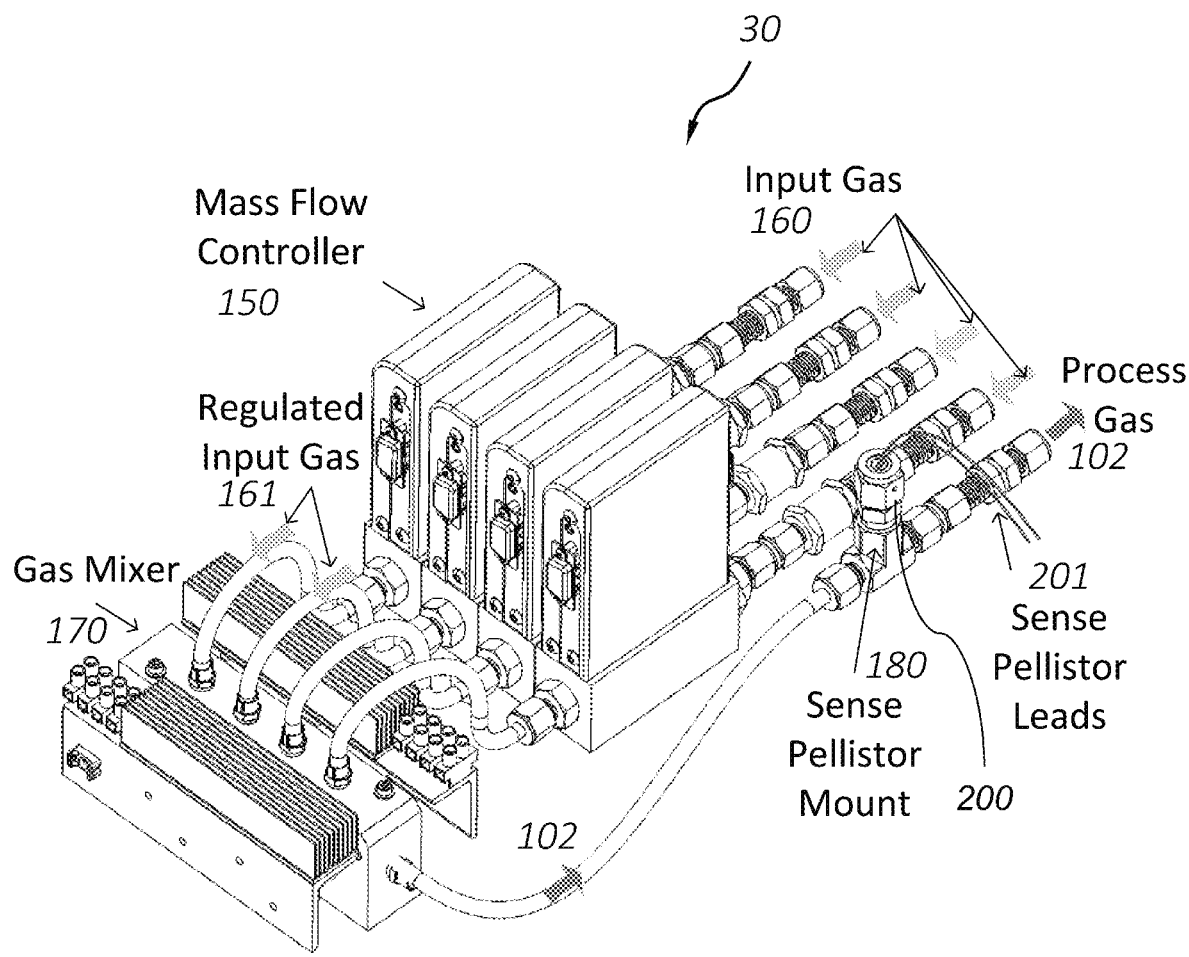
FIG. 5 depicts the process gas mixing network, including a pellistor mount 180, of the atmospheric pressure plasma system of FIG. 1.

Referring to FIG. 5, four mass flow channels 160 deliver precise digital control of a non-toxic gas mix 102 to the plasma head 100. Each gas flow channel includes a mass flow controller 150 that provides regulated input gas 161 to a gas mixer 170. Gas mixer 170 mixes the regulated input gases 161 and provides the gas mix 102. At least one helium mass flow channel is required as the dominant species carrier gas is helium at a concentration of more than 95% by volume. The dielectric properties and reactive properties of helium make it the ideal carrier gas. In addition to helium, other gasses may be added for chemical enhancement of the substrate 80 surface treatment. Examples of additional gasses used include nitrogen (N2), oxygen (O2), helium hydrogen (HeH2) mix, among others. The helium concentration in the process gas mix 102 is measured with a pellistor sensor 200 that is mounted on the pellistor mount 180 that is in line with the process gas mix 102. The pellistor mount 180 is located anywhere along the process gas 102 path between the gas mixer 170 and the plasma head 100. A pellistor sensor 200 is a device used to detect and measure helium concentration in a gas that has a different thermal conductivity compared to air. Pellistor 200 includes a thin-wire coil 202 encapsulated in a ceramic micro-bead 203, as shown in FIG. 6A. The thin-wire coil 202 is made of platinum or other exothermal metal or alloy, such as nickel-chromium alloy. The voltage drop Vp 210 across the coil leads is measured under the application of a constant current 205.

Referring to FIG. 3, plasma is formed when sufficient helium concentration flows in the gas passage 104, and RF Power 101 is applied between the RF electrodes 106 108. The time when RF Power is first applied, is known as plasma ignition time. Electrically, the helium acts as a dielectric medium between the RF electrodes, acting as a power capacitor.

Destructive arcing may occur as ignition is attempted when RF power is applied before the process gas helium concentration has reached a sufficient concentration. The arcing may damage the plasma head 100. An example scenario is when the software control algorithm starts the helium mass flow 150 concurrent with activation of RF power, not allowing enough time for the helium to transit the process gas line between the gas mixer 170 and the plasma head process gas input 102. This circumstance is avoided by enforcing a time delay between the helium mass flow start and the RF power activation. During this time delay unignited helium flows into the atmosphere as waste.

Destructive arcing may also occur after successful ignition, during plasma generation, when the process gas is suddenly starved of helium. An example scenario is when a slug of air is mistakenly introduced into the helium input 160. The mass flow controller 150 regulates flow rather than gas species, thereby injecting air into the energized plasma zone 105 as the dominant gas species.

Figure 7:
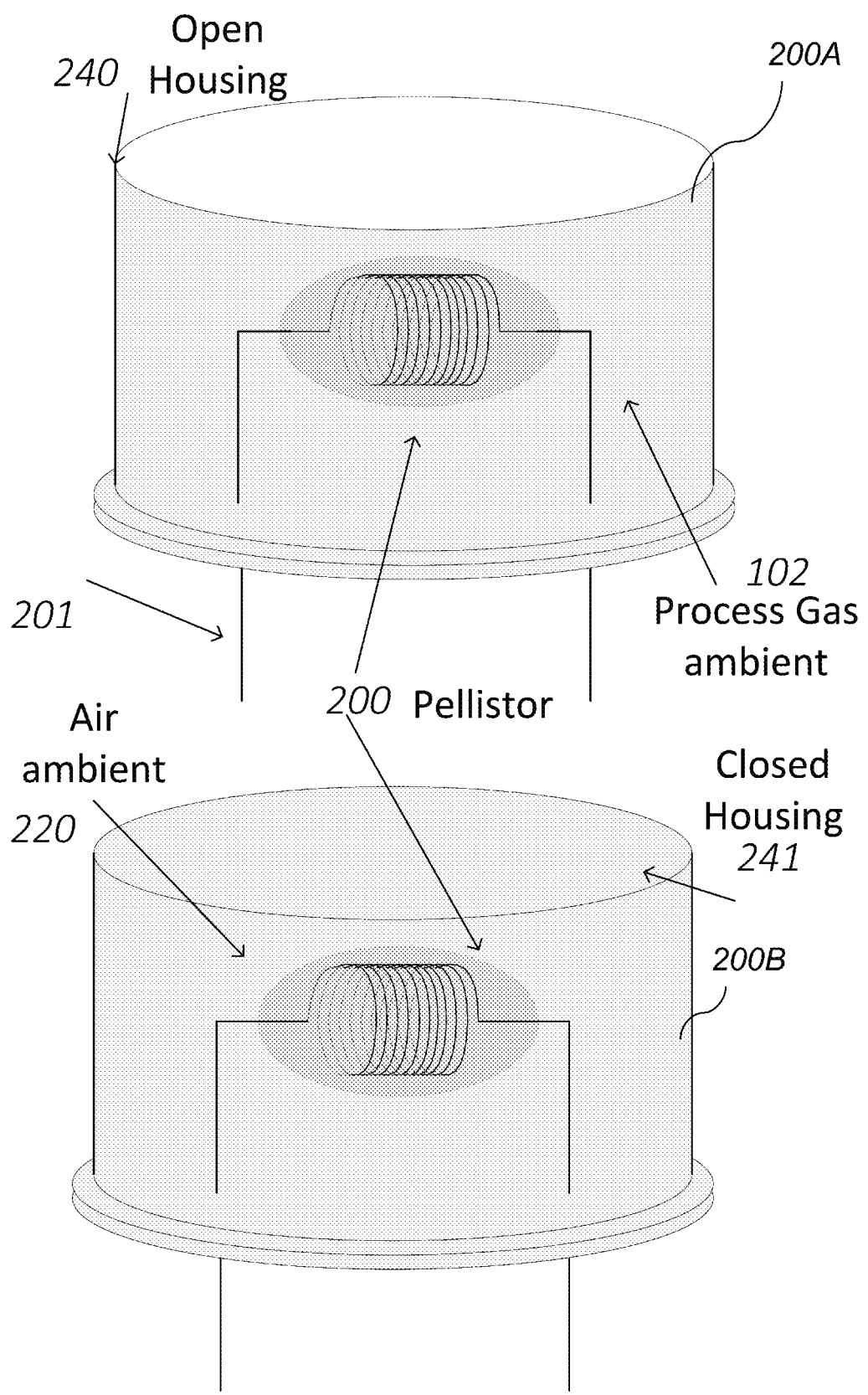
FIG. 7 depicts examples of a pellistor open 240 and closed 241 housing designs.

The present invention eliminates the above mentioned scenarios by sensing and measuring the helium concentration in the process gas 102 in real-time. The sensor mechanism is located upstream of the plasma source and provides real-time monitoring of the helium concentration in a process gas entering the gas inlet during plasma operation. The sensor mechanism includes a matched pair (same lot) of thermo-resistive pellistors 200A and 200B, shown schematically in FIG. 6B and FIG. 6C and FIG. 7. Each pellistor 200A, 200B, includes a self-heated coil 202 of a small diameter platinum wire supported in a refractory bead 203. One of the beads (e.g. in Sense Pellistor 200A) is supported in an open housing 240 and is configured to be exposed to the gas that is to be detected, i.e., helium. The other bead (in Reference Pellistor 200B) is sealed in a closed housing 241 that contains air. Each bead is heated when a current 205 is applied across the coil leads and the coil resistance increases with the bead temperature. Due to Ohm's law, as the coil resistance increases, the voltage drop Vp 210 across the pellistor coil leads increases with the bead temperature. When the bead in pellistor 200A is exposed to a gas (i.e., helium) whose thermal conductivity is significantly different to that of air, the rate of heat loss from this bead changes, as does its resistance. In particular, the bead temperature of pellistor 200A decreases when the thermal conductivity of the ambient gas increases. It is observed that the electrical resistance of pellistor 200A monotonically decreases as it is cooled by the presence of the increasing helium content in the process gas. The voltage drop Vp(He) 231 across the coil leads of the bead of pellistor 200A is measured and compared to the voltage drop Vp(air) 230 across the coil leads of the bead of the reference pellistor 200B using a bridge circuit 250, shown in FIG. 8A. The comparison between Vp(He) 231 and Vp(air) 230 is used to generate a Vgas 252 measurement that is then used to determine the helium gas concentration using the graph of FIG. 9. The pellistor sensor system is used to detect gases with low molecular weight (e.g. helium, or hydrogen), which have much greater thermal conductivities than that of air, consequently giving the highest response. The uniquely high thermal conductivity of helium, relative to air, cools the exposed pellistor bead 200A and the Vgas 252 output of the bridge circuit 250 increases monotonically with the helium gas concentration, as shown in FIG. 9.

The output of the bridge circuit is amplified and the Vgas 252 voltage output is scaled as required for measurement with a suitable low output impedance. The amplified voltage output serves as input to an analog to digital converter for digital presentation to a microcontroller, microcomputer, field-programmable gate array (FPGA), or other real-time processing device. The amplified voltage output serves as input to one or more voltage comparator circuits, and the logic output state of each comparator changes as the amplified voltage value crosses a threshold reference voltage value.

Figure 8A:
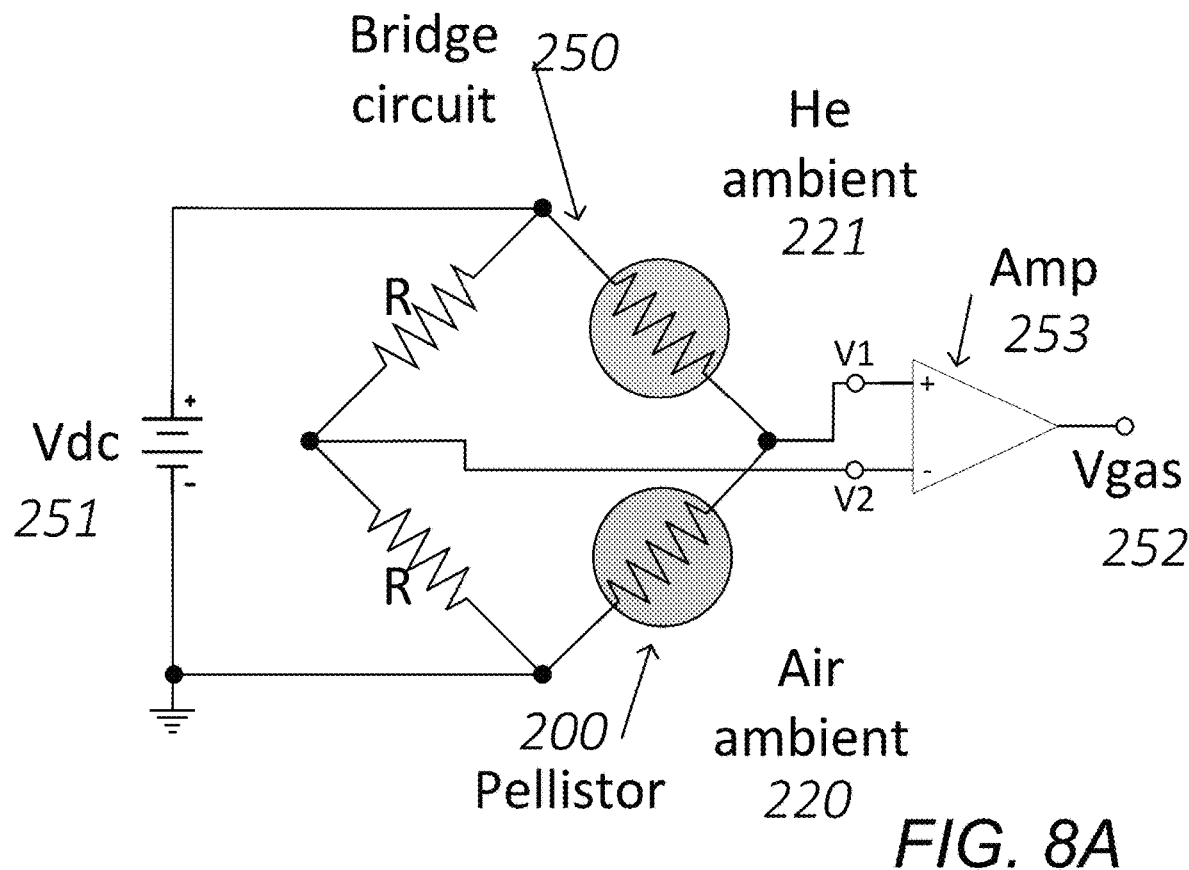
FIG. 8A depicts the signal conditioning bridge circuit 250 used for measuring the resistive change in the He ambient 221 exposed pellistor and for providing a DC voltage output Vgas 252.
Figure 8B:
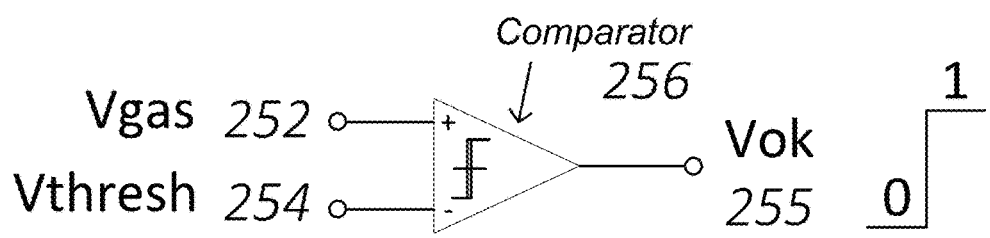
FIG. 8B depicts a comparator 252 used for downstream signal processing of the output Vgas 252.
Figure 8C:
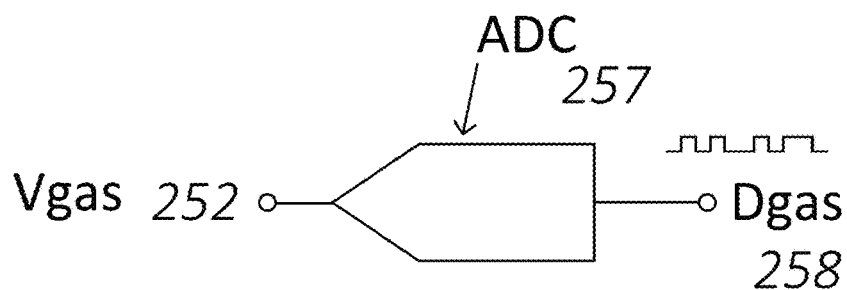
FIG. 8C depicts an analog-to-digital converter (ADC) 257 used for downstream signal processing of the output Vgas 252.
Figure 9:
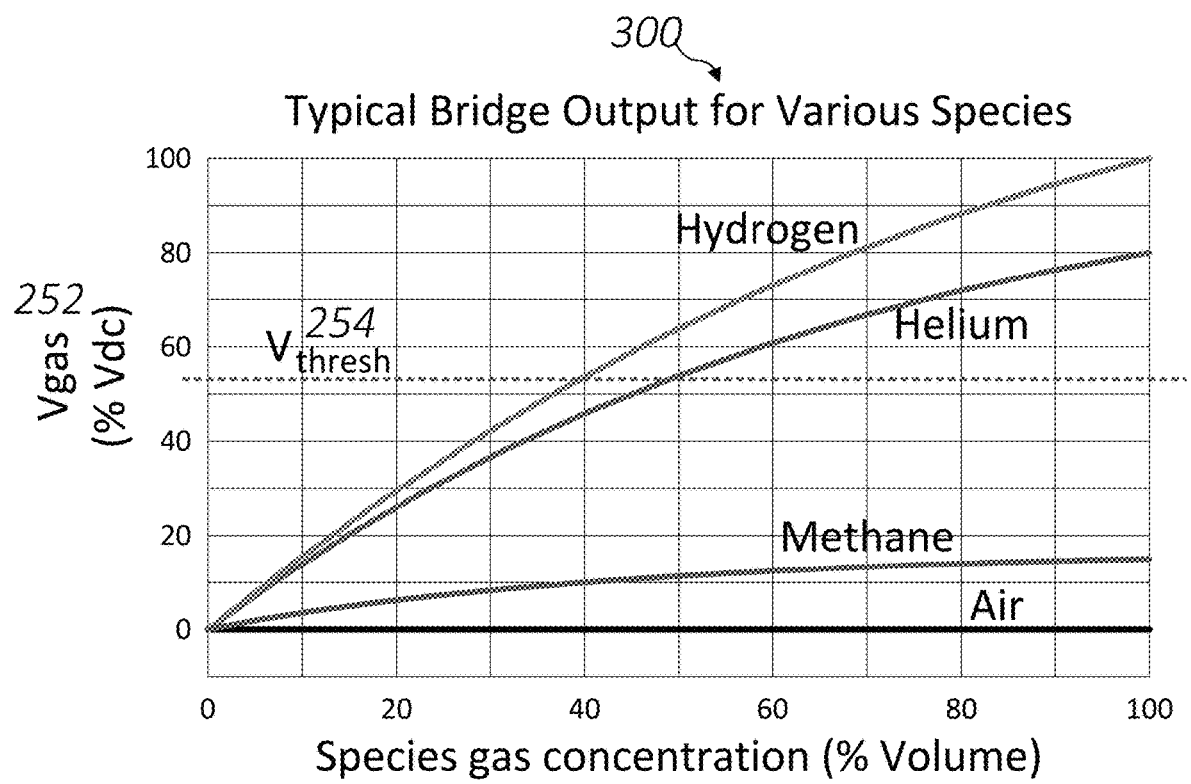
FIG. 9 depicts plots of the bridge circuit 250 output Vgas 252 versus the gas concentration for various gas species.

Referring to FIG. 8A-FIG. 9, one implementation of the invention is to activate a plasma-off safety circuit, if the helium concentration, as measured by Vgas 252, is below a Vthresh 254 when ignition RF Power 101 is applied to start the plasma. The case when Vgas 252 is below Vthresh 254 indicates that there is insufficient helium to safely ignite the plasma. A comparator 256 circuit output state Vok 255 is applied as a downstream software or hardware input to prohibit the application of RF Power 101, as shown in FIG. 8B.

Similarly, another implementation of the invention is to activate a plasma-off safety circuit, if the helium concentration, as measured by Vgas 252, transitions from above Vthresh 254 to below Vthresh 254 during plasma generation. This condition indicates a contamination of the helium supply, such as accidental ingress of air. A comparator 256 circuit output state Vok 255 is applied as a downstream software or hardware input to shut off the application of RF Power 101, as shown in FIG. 8B.

Figure 10:
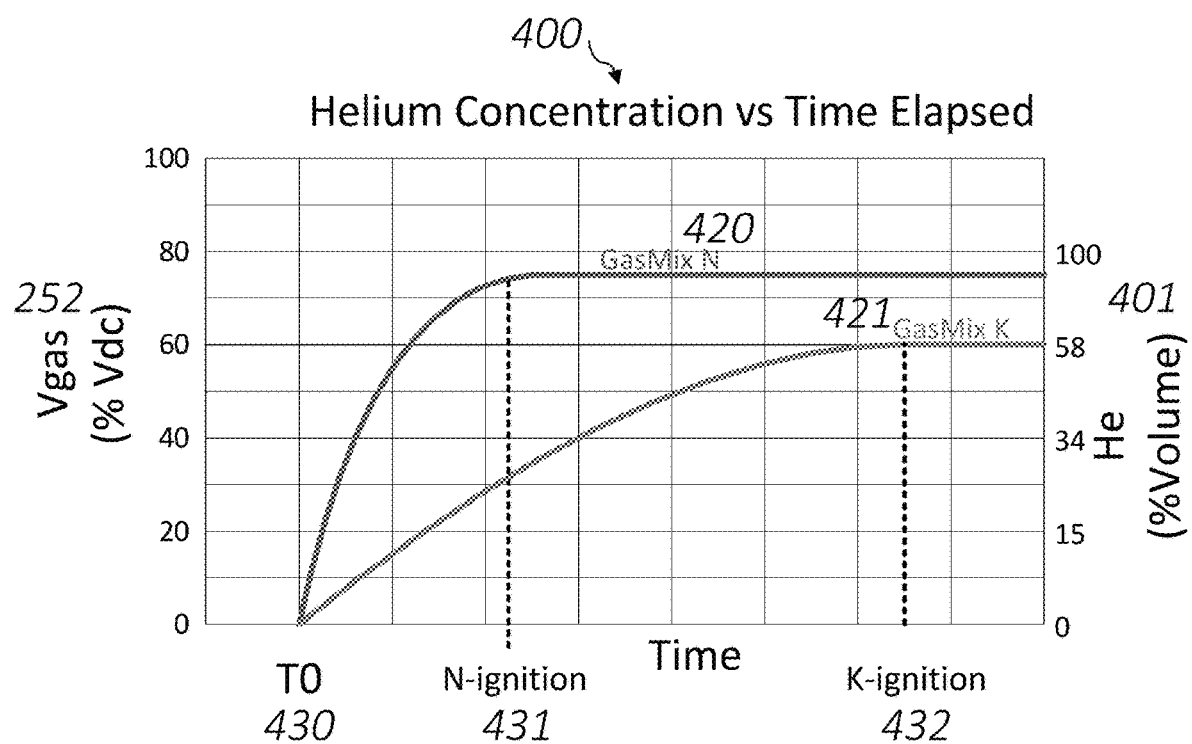
FIG. 10 depicts plots of helium concentration versus time elapsed for GasMix N 420 and GasMix K 421.

In another implementation, the invention is used to optimize the ignition time of the process gas. FIG. 10 depicts the measured helium concentration (as measured by Vgas 252) as a function of the elapsed time for two different process gas mixes, shown as GasMix N 420 and GasMix K 421. The shortest possible ignition time (initial application of RF Power 101), for N-ignition 431 or K-ignition 432 is triggered based on the transition of GasMix N 420 or GasMix K 421 to an acceptable helium concentration 401, respectively. The analog signal Vgas 252 is digitized with and analog to digital converter (ADC) 257 circuitry to generate the digital signal Dgas 258, as shown in FIG. 8C. The digitized Dgas 258 is then used as an input to a microcontroller algorithm that controls the process gas 102 flow and the RF Power 101. This ignition time optimization enables minimal process cycle times and minimal process gas consumption.

Several embodiments of the present invention have been described. Nevertheless, it will be understood that various modifications may be made without departing from the spirit and scope of the invention. Accordingly, other embodiments are within the scope of the following claims.

What is claimed is:

1. An atmospheric pressure plasma system comprising:
an atmospheric pressure plasma source that generates a glow discharge-type plasma;
wherein the atmospheric pressure plasma source comprises a plasma head and a gas sensor system;
wherein the plasma head comprises a gas inlet, a gas passage surrounded by a dielectric liner, a radio frequency (RF) electrode and a ground electrode and wherein the RF electrode and the ground electrode are arranged at opposite sides of an outer surface of a segment of the gas passage; and
wherein the gas sensor system comprises a first pellistor that is exposed to a process gas entering the gas inlet and provides real-time monitoring of the presence and concentration of helium in the process gas entering the gas inlet during plasma operation; and
wherein the first pellistor comprises a thermo-resistive pellistor and the thermo-resistive pellistor comprises an electrical resistance that decreases monotonically as the first pellistor is cooled by the increasing concentration of helium in the process gas.

2. An atmospheric pressure plasma system comprising:
an atmospheric pressure plasma source that generates a glow discharge-type plasma;
wherein the atmospheric pressure plasma source comprises a plasma head and a gas sensor system;
wherein the plasma head comprises a gas inlet, a gas passage surrounded by a dielectric liner, a radio frequency (RF) electrode and a ground electrode and wherein the RF electrode and the ground electrode are arranged at opposite sides of an outer surface of a segment of the gas passage; and
wherein the gas sensor system comprises a first pellistor that is exposed to a process gas entering the gas inlet and provides real-time monitoring of the presence and concentration of helium in the process gas entering the gas inlet during plasma operation; and
wherein the first pellistor comprises a coil supported in a refractory bead and wherein the refractory bead of the first pellistor is supported in an open housing and is exposed to the process gas and wherein the gas sensor system further comprises a second pellistor and the refractory bead of the second pellistor is supported in a closed housing that contains air.

3. The system of claim 2, further comprising a bridge circuit, wherein the bridge circuit comprises said first and second pellistors, and wherein a voltage drop across the coil of the first pellistor is measured and compared to a voltage drop across the coil of the second pellistor with the bridge circuit to provide a bridge circuit output.

4. The system of claim 3, wherein the bridge circuit output increases monotonically with the increasing helium concentration in the process gas and is used to measure the helium concentration in the process gas.

5. The system of claim 4, further comprising a comparator and a plasma-off safety circuit and wherein the comparator compares the measured helium concentration in the process gas to a threshold value and activates the plasma-off safety circuit if the measured helium concentration in the process gas is below the threshold value.

6. The system of claim 4, further comprising a comparator and a plasma-off safety circuit and wherein the comparator compares the measured helium concentration in the process gas to a threshold value and activates the plasma-off safety circuit if the measured helium concentration in the process gas transitions from a value above the threshold value to a value below the threshold value.

7. The system of claim 4, further comprising an analog to digital conversion (ADC) circuit and wherein the ADC circuit converts the measured helium concentration in the process gas to a digital signal that is used to trigger plasma ignition.

8. The system of claim 2, wherein the process gas comprises a thermal conductivity that is less than the thermal conductivity of air.

9. The system of claim 2, wherein the process gas comprises one of helium, hydrogen, nitrogen, oxygen, or mixtures thereof.

10. A method for measuring the presence and concentration of helium in a process gas in an atmospheric pressure plasma source comprising:
providing an atmospheric pressure plasma source that generates a glow discharge-type plasma, wherein the atmospheric pressure plasma source comprises a plasma head and a gas sensor system, wherein the plasma head comprises a gas inlet, a gas passage surrounded by a dielectric liner, a radio frequency (RF) electrode and a ground electrode and wherein the RF electrode and the ground electrode are arranged at opposite sides of an outer surface of a segment of the gas passage, and wherein the gas sensor system comprises a first pellistor;
exposing the first pellistor to a process gas entering the gas inlet and measuring the first pellistor's electrical resistance; and
wherein the first pellistor comprises a thermo-resistive pellistor and the thermo-resistive pellistor comprises an electrical resistance that decreases monotonically with increasing helium concentration in the process gas.

11. A method for measuring the presence and concentration of helium in a process gas in an atmospheric pressure plasma source comprising:
providing an atmospheric pressure plasma source that generates a glow discharge-type plasma, wherein the atmospheric pressure plasma source comprises a plasma head and a gas sensor system, wherein the plasma head comprises a gas inlet, a gas passage surrounded by a dielectric liner, a radio frequency (RF) electrode and a ground electrode and wherein the RF electrode and the ground electrode are arranged at opposite sides of an outer surface of a segment of the gas passage, and wherein the gas sensor system comprises a first pellistor;
exposing the first pellistor to a process gas entering the gas inlet and measuring the first pellistor's electrical resistance; and
wherein the first pellistor comprises a coil supported in a refractory bead and wherein the refractory bead of the first pellistor is supported in an open housing and is exposed to the process gas and wherein the gas sensor system further comprises a second pellistor and the refractory bead of the second pellistor is supported in a closed housing that contains air.

12. The method of claim 11, further comprising:
providing a bridge circuit, wherein the bridge circuit comprises said first and second pellistors; and
measuring a voltage drop across the coil of the first pellistor and comparing it to a voltage drop across the coil of the second pellistor with the bridge circuit.

13. The method of claim 12, wherein the bridge circuit provides an output that increases monotonically with the increasing helium concentration in the process gas and is used to measure the helium concentration in the process gas.

14. The method of claim 13, further comprising:
providing a comparator and a plasma-off safety circuit;
comparing the measured helium concentration in the process gas to a threshold value with the comparator; and
activating the plasma-off safety circuit if the measured helium concentration in the process gas is below the threshold value.

15. The method of claim 13, further comprising:
providing a comparator and a plasma-off safety circuit;
comparing the measured helium concentration in the process gas to a threshold value with the comparator; and
activating the plasma-off safety circuit if the measured helium concentration in the process gas transitions from a value above the threshold value to a value below the threshold value.

16. The method of claim 13, further comprising:
providing an analog to digital conversion (ADC) circuit; and
converting the measured helium concentration in the process gas to a digital signal with the ADC circuit; and
using the digital signal to trigger plasma ignition.

17. The method of claim 11, wherein the process gas comprises a thermal conductivity that is less than the thermal conductivity of air.

18. The method of claim 11, wherein the process gas comprises one of helium, hydrogen, nitrogen, oxygen, or mixtures thereof.

* * * * *